United States Patent
Birth

(10) Patent No.: US 8,102,215 B2
(45) Date of Patent: Jan. 24, 2012

(54) COMPENSATED HIGH-SPEED PLL CIRCUIT

(75) Inventor: Winfrid Birth, Veitsbronn (DE)

(73) Assignee: ST-Ericsson SA, Plan-les-Ouates (CH)

( * ) Notice: Subject to any disclaimer, the term of this patent is extended or adjusted under 35 U.S.C. 154(b) by 682 days.

(21) Appl. No.: 11/575,214

(22) PCT Filed: Aug. 30, 2005

(86) PCT No.: PCT/IB2005/052840
§ 371 (c)(1),
(2), (4) Date: Oct. 19, 2009

(87) PCT Pub. No.: WO2006/030335
PCT Pub. Date: Mar. 23, 2006

(65) Prior Publication Data
US 2010/0026396 A1  Feb. 4, 2010

(30) Foreign Application Priority Data
Sep. 13, 2004 (EP) .................................. 04104413

(51) Int. Cl.
*H03L 7/10* (2006.01)
(52) U.S. Cl. ........................................... 331/44; 331/17
(58) Field of Classification Search .................... 331/44, 331/17
See application file for complete search history.

(56) References Cited

U.S. PATENT DOCUMENTS

| 6,157,271 A | 12/2000 | Black et al. |
| 6,300,808 B1 | 10/2001 | Kuehn et al. |
| 6,734,749 B2 | 5/2004 | Mattisson et al. |
| 7,548,122 B1 * | 6/2009 | Groe et al. ................... 331/16 |
| 2003/0076175 A1 | 4/2003 | Fischer et al. |

FOREIGN PATENT DOCUMENTS

| JP | 267822 A | 9/1988 |
| JP | 4196716 A | 11/1990 |
| JP | 7202638 A | 12/1993 |
| JP | 2001339301 A | 12/2001 |
| JP | 200480624 A | 3/2004 |

OTHER PUBLICATIONS

Gardner, F. M. (1979). "Phaselock Techniques" (2nd ed.) (pp. ii-xi, 8-24, 43-64 & 92-136). New York: John Wiley & Sons, Inc.

* cited by examiner

*Primary Examiner* — Joseph Chang
(74) *Attorney, Agent, or Firm* — Potomac Patent Group PLLC

(57) ABSTRACT

The invention relates to a compensation method and phase-locked loop (PLL) circuit, wherein different kinds of two-point modulations are used and the integral regulator of a loop filter is replaced by introducing predetermined settings at the loop filter or at a voltage controlled oscillator. Thereby, the dynamic settling time of the PLL circuit can be improved to gain time for other circuit components which can thus assure required precision for the modulation.

14 Claims, 4 Drawing Sheets

COMPENSATED HIGH-SPEED PLL CIRCUIT

The present invention relates to a phase-locked loop (PLL) circuit and a method of compensating such a PLL circuit to reduce settling times especially for first-order PLL loops. The term "first-order PLL" is used here to designate a PLL with no integration function (I-regulator term) in the Loop Filter.

A phase-locked loop circuit outputs a signal synchronized with an input signal. Essentially, it produces an output signal which tracks an input signal in frequency and exhibits a fixed phase relationship to the input signal. Usually, PLL circuits comprise a phase/frequency detector, a loop filter, such as a low pass filter, a voltage-controlled oscillator (VCO), and if necessary, a frequency divider. If the clock frequency input to the phase detector and the output frequency of the VCO are equal, the frequency divider is not required.

In the Global System for Mobile communications (GSM) standard, a transmitting VCO must be able to lock a 100 MHz step to better than 90 Hz accuracy in less than 200 microseconds. This is due to the need to minimize current consumption (drain) by turning the transmit subsystem off when not in use and restart quickly upon turn on. It is furthermore important that this specification be met over a significant range of temperature and part variations. Conventional loop filter configurations can be inadequate due to the slowness of an Integral-regulator. The desired PLL bandwidth limits the possible speed of Integral-regulators due to the need of good stability margins at the loop. The bandwidth of a PLL is limited by requirements for filtering that is provided by a PLL.

Conventional PLL circuits comprise charge-pump phase detectors, wherein the charge pump charges and discharges a capacitor in the low pass filter, depending upon advanced or delayed phase signals. The low pass filter then eliminates high frequency components and noise of the output voltage signal, which correspond to the phase difference. The low pass filter smoothes the phase difference signal to convert the same to a control voltage which is supplied to the VCO to control the oscillation frequency. The VCO is the most critical component of the PLL circuit. The output frequency dependence on the control voltage is determined by a conversion gain $V_{VCO}$ of the VCO. Due to the fact that the PLL circuit is a negative feedback loop, it functions to minimize the phase difference between the oscillation signal and a frequency input signal supplied to the phase detector. When the PLL circuit reaches a lock-in point or steady state, the phases of the two signals match with one another, i.e., the oscillation phase and frequency of the VCO output signal become the same as the phase and frequency of the frequency input signal.

For an ideal case, the input phase $\Theta_i$ of the frequency input signal, the error phase $\Theta_e$ at the output of the phase detector and the output phase $\Theta_o$ at the VCO are zero at settled mode or state which may also be referred to as locked mode or state, or steady mode or state.

In 'Phase Lock Techniques', F. M. Gardener, Wiley and Sons, New York, 1979, $2^{nd}$ Edition, page 48, a PLL circuit is named 'Second-Order-Loop', wherein this name is related to the number of integral terms 1/s in the Laplace transfer function of the open loop. In particular, the open-loop transfer function can be expressed as follows:

$$G(s) = K_p Z_{LF} K_0/s, \quad (1)$$

wherein $Z_{LF} = (R+1/sC)F_r(S)$, so that equation (1) can be enhanced as follows:

$$G(s) = K_p R K_0 F_r(s)(1/s + 1/(s^2 RC)), \quad (2)$$

wherein $F_r(s)$ denotes the transfer function of a ripple filter which may be included in the loop filter, $Z_{LF}$ denotes the impedance of the loop filter, R denotes the resistance of a resistor and C the capacitance of a capacitor of an RC integration circuit of the loop filter, $K_p$ denotes the transfer factor of the phase detector, $K_0$ denotes the transfer factor of the VCO and s corresponds to the Laplace operator ($s=j\omega=j2\pi f$). Due to the fact that first-order loops do not comprise the integration capacitor C, the second term $1/(s^2 RC)$ is omitted for first-order loops. Neglecting the transfer function of the ripple filter and thus setting $F_r=1$, the open loop transfer function of the first-order loop can be reduced to:

$$G(s) = K_p R K_0/s \quad (3)$$

which function describes an asymptote which crosses the 0 dB axis at a circular frequency $\omega_A = K_p R K_0$.

However, due to the fact that first-order loops do not show any integrative behavior, huge steady-state phase errors are obtained. Second-order loops with integrating behavior can eliminate such steady-state phase errors, but at the expense of reduced settling speed.

Document U.S. Pat. No. 6,157,271 discloses a PLL circuit with rapid tuning function over a wide frequency range. A controller generates a digital open loop frequency control signal supplied to a digital-to-analog converter (DAC) which produces a variable DC reference potential. This reference potential is used as an open-loop tuning voltage added at the output of the phase detector to reduce acquisition time of the PLL circuit.

It is therefore an object of the present invention to provide an improved PLL circuit and compensation method, by means of which steady-state phase errors and settling times can be reduced.

This object is achieved by a PLL circuit as claimed in claim 1 and by a compensation method as claimed in claim 12.

Accordingly, an offset or compensation voltage is supplied to the loop filter means during a specific time phase of close-loop operation and the voltage value of the offset voltage is set in accordance with the characteristic of the voltage-controlled oscillator means. Due to the well-selected offset voltage, which has a function similar to the voltage at the integrating element of a second-order loop, it is possible to settle a first-order loop without huge steady-state phase errors. Applied to first-order loops, the suggested solutions leads to a loop settlement at much higher speed than second-order loops, which is highly valuable for a lot of applications.

Furthermore, compensating means may be provided for generating a compensation current and for supplying the compensation current to an input of the loop filter means to compensate for a phase error of a phase detector means of the PLL circuit. Thereby, the disadvantage of a remaining steady-state phase error can be further reduced. The compensating means may comprise resistor means serially coupled between the voltage generator means and an input resistor of the loop filter means, wherein a current source may be connected in parallel to the resistor means. Thereby, an increased current can be supplied, so that leakage currents from the current source are less dangerous.

The setting means may be adapted to set the offset voltage to a value required at the input of the voltage-controlled oscillator to generate a desired output frequency. Hence, in the steady-state, the offset voltage is set to about a value required according to the VCO curve for the desired frequency, so that the steady-state phase error can be significantly reduced.

Furthermore, the setting means may be arranged to pre-select a characteristic curve of the voltage-controlled oscillator based on a desired output frequency of the voltage-controlled oscillator. Thereby, the conversion characteristic of the voltage-controlled oscillator can be adapted to the desired frequency to thereby minimize steady-state phase errors.

In particular, the setting means may be arranged to control the voltage-controlled oscillator so as to shift the VCO characteristic. The shifting of the VCO characteristic provides the advantage that a change of the tuning or control voltage of the voltage-controlled oscillator can be prevented. The shifting of the VCO characteristic is an alternative compared to DC settings at the Loop Filter in front of the VCO.

Frequency- or Phase-Modulation for a transmitter can be injected at a PLL system in various manner but combined with above measures of compensating. Such a combination leads to an enhanced compensating means which may comprise first conversion means for converting an input modulation frequency into the compensation current. Furthermore, second conversion means may be provided for converting the modulation frequency into an input phase signal. This assures that the error phase is not changed when the modulation frequency is changed.

As an alternative according to another aspect of the present invention, third conversion means may be provided for converting the input modulation frequency into a divider factor of a fractional divider provided in the PLL circuit. In this case, the first and second conversion means can be used additionally and the modulation frequency can be directly supplied to the phase detector means.

The present invention will now be described based on preferred embodiments with reference to the accompanying drawings, in which.

The preferred embodiments will now be described in connection with a PLL circuit without integrating regulator in the loop filter but with compensation measures for obtaining reduce settling times and reduced steady-state phase errors.

Figure 1:
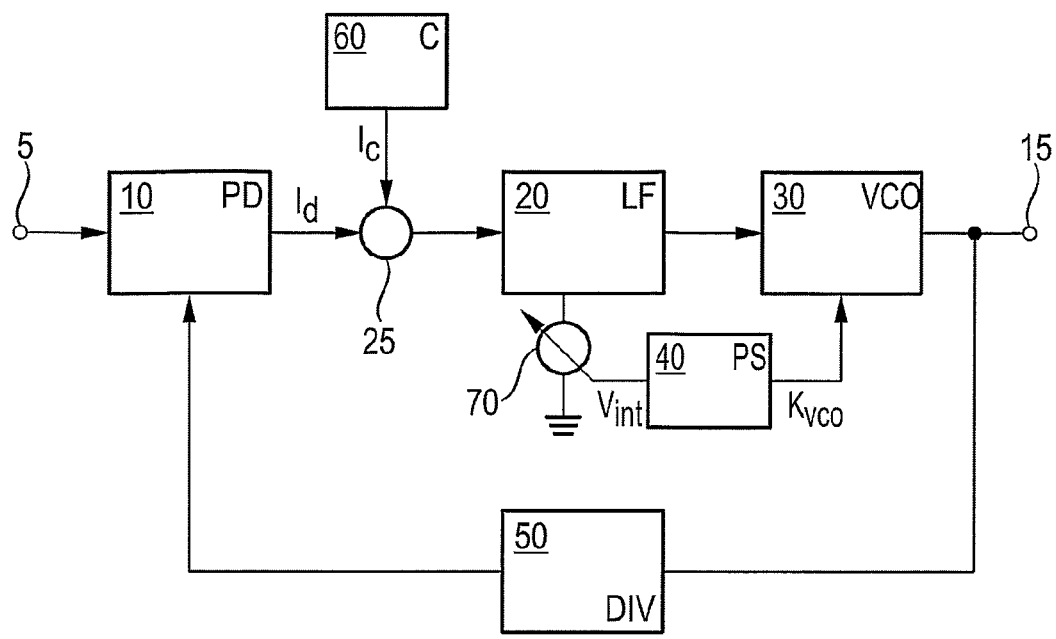
FIG. 1 shows a schematic block diagram of a PLL circuit according to the preferred embodiments.

FIG. 1 shows a schematic block diagram of a PLL circuit according to the preferred embodiments. The PLL circuit comprises a phase detector 10, a loop filter 20, which may be a low pass filter, a VCO 30, and a frequency divider 50. Furthermore, a compensation circuit 60 is provided which supplies a compensation current $I_c$ to a summing node 25 where the compensation current $I_c$ is added to a detection current $I_d$ which corresponds to the phase difference detected by the phase detector 10.

In addition thereto, a pre-selection circuit 40 is provided for pre-selecting a VCO curve or characteristic for a desired frequency $f_{CH}$ and the values of the divider ratio $N_{CH}$ of the frequency divider 50, the conversion gain $K_{VCO}$ of the VCO 30 or at least one of these parameters. Furthermore, the pre-selection circuit 40 controls a voltage source 70 which is connected between the loop filter 20 and a reference potential, e.g. ground potential, to introduce an offset voltage $V_{int}$ to the loop filter 20.

The phase detector 10 is a device, which detects the difference in phase between an input signal supplied to an input terminal 5 and an output signal of the VCO 30 supplied to an output terminal 15 and fed back via the frequency divider 50. Based on the difference between the two input signals, the phase detector 10 produces the detection current $I_d$ proportional to the amount of the phase difference. In the PLL circuit, the input signal received at the input terminal 5 corresponds to a frequency reference signal and the output signal at the output terminal 15 corresponds to a feedback or output frequency signal. The loop filter 20 eliminates high frequency components and noise and smoothes the phase difference signal to convert the same to an error or control voltage which is supplied to the VCO 30 to control the oscillator frequency. The gain $K_{vco}$ of the VCO 30 is associated with the voltage-to-frequency conversion. The frequency dependence on the control voltage is determined by this conversion gain $K_{vco}$ of the VCO 30.

The pre-selection circuit 40 is arranged to set the voltage $V_{int}$ of the voltage source 70 to a value which the characteristic curve of the VCO 30 requires for generating a desired frequency. Or, alternatively, the pre-selection circuit 40 shifts the VCO curve. When the PLL circuit is settled, i.e. when an equilibrium state of the control loop has been reached, a small voltage error still remains within the loop filter 20. This error causes a steady-state phase error at the output of the phase detector 10. The additional compensation current $I_c$ is supplied to compensate this error.

Figure 2:
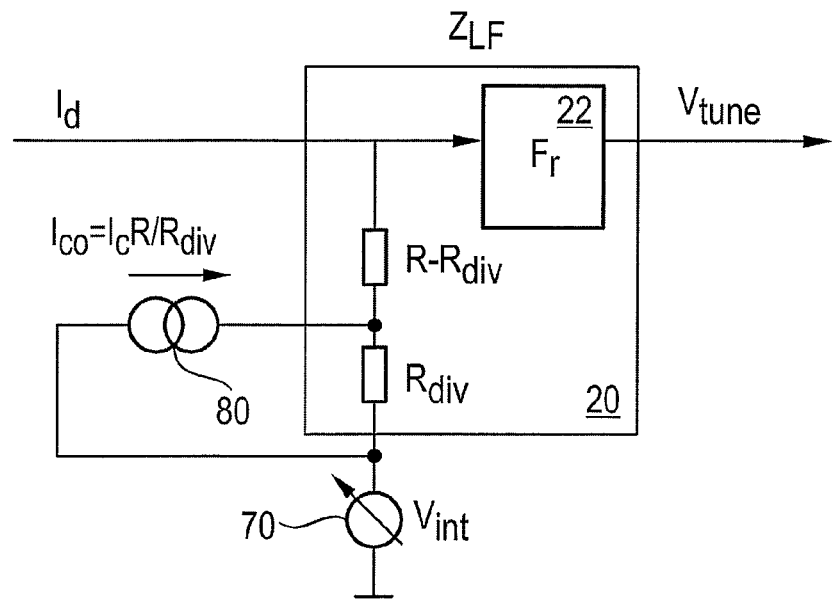
FIG. 2 shows a schematic circuit diagram of an introduction of a compensation current to an offset voltage at a loop filter according to the preferred embodiments.

FIG. 2 shows a schematic circuit diagram as an option for adding the compensation current $I_c$ at the input of the loop filter 20. Hence, the circuitry of FIG. 2 can be used to replace the combination of the compensation block 60, the summing node 25 and the loop filter block 20 in FIG. 1. In particular, according to FIG. 2, the loop filter 20 which has an impedance $Z_{LF}$ comprises a ripple filter 22 with a transfer function $F_r$ which outputs the control or tune voltage $V_{tune}$ to be supplied to the VCO 30. Furthermore, the loop filter 20 comprises a series connection of an input resistor of a resistance value $(R-R_{div})$ and a divisional resistor $R_{div}$. The voltage source 70 is serially connected between the series connection of the input resistor and the divisional resistor, and a reference potential. Furthermore, a current source 80 is connected in parallel to the divisional resistor $R_{div}$ and supplies an increased compensation current $I_{co}$ which is obtained by multiplying the compensation current $I_c$ by the ratio between the total resistance R of the series connection and the resistance value of the divisional resistor $R_{div}$. Thereby, a total voltage of $V_{int0} = I_c \cdot R + V_{int}$ can be realized at the input of the loop filter 20 with an increased current $I_{co} = I_c \cdot R/R_{div}$. In view of the fact that usually the compensation current $I_c$ is a small current, it is better to use the increased current $I_{co}$ and a circuitry like the one depicted in FIG. 2. Thereby, leakage currents from the current source 80 are less dangerous.

Figure 3:
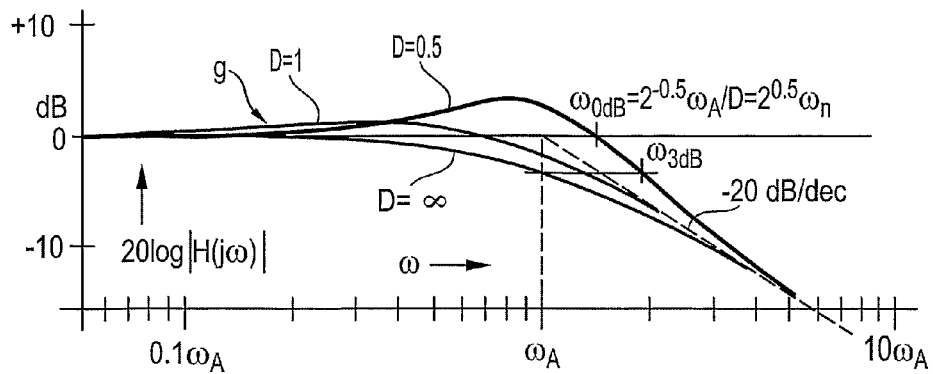
FIG. 3 shows a schematic frequency diagram indicating close-loop behavior of a PLL circuit.

FIG. 3 shows a schematic frequency diagram of a closed-loop behavior of different PLL circuits with neglected ripple filter (i.e. $F_r = 1$). In FIG. 3, the parameter D indicates the damping or attenuation factor of the second-order term. The parameter $\omega_n$ corresponds to the Eigen-frequency and the parameter ($\omega_A$ corresponds to the critical frequency which defines the corner for the slope with −20 dB/dec. The curve for D=∞ corresponds to the first-order loop where the second-order term is zero, and thus also to the PLL circuits according to the preferred embodiments.

Figure 4A:
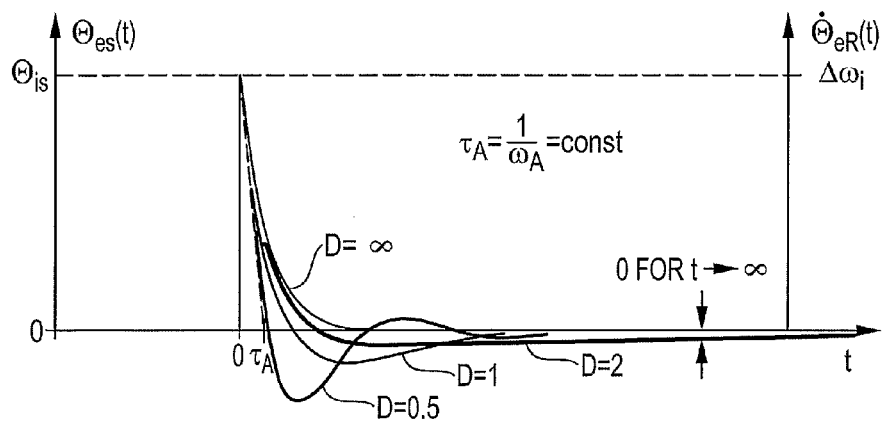
FIGS. 4a and 4b show schematic waveform diagrams indicating error phase behavior of different PLL loops.
Figure 4B:
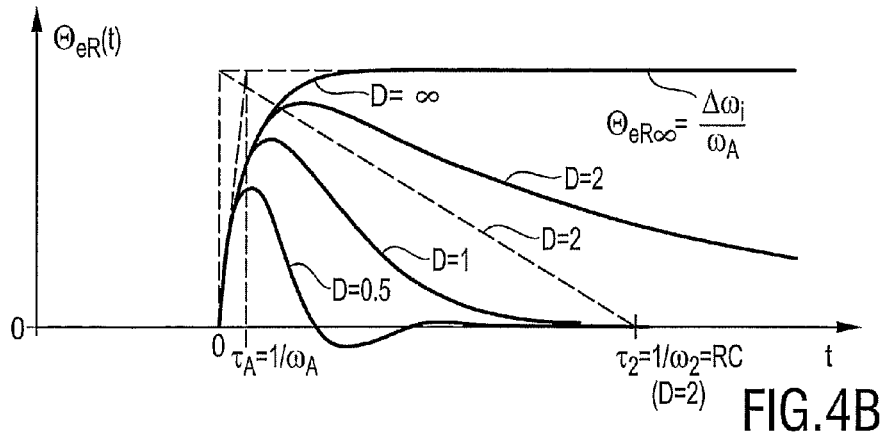

FIGS. 4a and 4b show schematic signaling or waveform diagrams indicating time behaviors of the error phase at the output of the phase detector 10 in case of a phase step of the input phase $\Theta_i$ and the case of a frequency step at the input circular frequency ($\omega_i$, respectively. As can be gathered from FIG. 4a, the phase step response $\Theta_{es}(t)$ depends on the damping factor D and provides a fast settlement for the case of D=∞ which corresponds to a first-order loop. According to FIG. 4b, the phase response $\Theta_{eR}(t)$ for a frequency step starts with a ramp and returns to zero with a speed depending on the damping factor D. In case of an infinitive damping factor D=∞, the error phase will not return to zero and will stay at a steady-state phase error $\Theta_{eR\infty}=\Delta\omega_i/\omega_A$, which corresponds to the ratio between the frequency step and the critical frequency.

According to the preferred embodiments, the introduction of the pre-selection circuit 40 and the compensation circuit 60 serves to compensate the phase errors indicated in FIGS. 4a and 4b.

Figure 5:
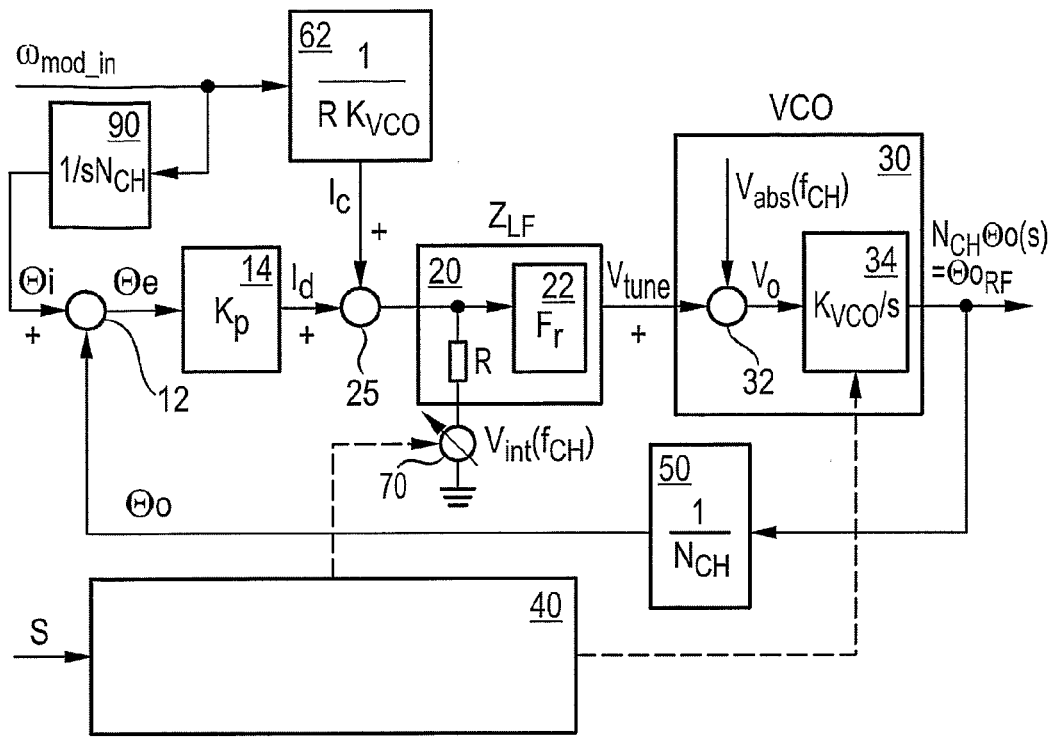
FIG. 5 shows a schematic functional block diagram of a PLL circuit according to a first preferred embodiment.

FIG. 5 shows a schematic functional block diagram of a PLL circuit according to the first preferred embodiment. Here, the functional behavior of the phase detector is indicated by a subtraction node 12 and a conversion unit 14 with a conversion function or parameter $K_p$ which expresses the conversion from the detected phase error $\Theta_e$ to the detecting current $I_d$. Furthermore, the compensation current $I_c$ is generated in the compensation unit 60 by a conversion unit 62 the function of which can be expressed by $1/RK_{vco}$ which expresses the generation of the compensation current $I_c$ based on the input modulation frequency $\omega_{mod\_in}$, where R corresponds to the resistance value of the input resistor of the loop filter 20 and $K_{vco}$ corresponds to the conversion gain of the VCO 30. The input phase $\Theta_i$ is also generated from the input modulation frequency $\omega_{mod\_in}$ using another conversion unit 90 which performs conversion based on the function $1/sN_{CH}$, where s denotes the Laplace operator. The sum of the compensation current $I_c$ and the detecting current $I_d$ is obtained at the summing node 25 and is supplied to the loop filter 20 to which the controllable voltage source 70 is connected, which generates the offset voltage $V_{int}(f_{CH})$ as a function of the channel frequency $f_{CH}$ of the received transmission channel.

The loop filter 20 converts the summed current into a tuning or control voltage $V_{tune}$ which is supplied to a subtracting node 32 of the VCO 30. At the subtracting node 32, a voltage $V_{abs}(f_{CH})$ is subtracted to be able to increase the control voltage $V_{tune}$ and thus present a realistic voltage range for the control voltage $V_{tune}$. The voltage difference $V_0$ is supplied to a conversion unit 34 of the VCO 30, at which the voltage difference $V_0$ is converted to an output signal $N_{CH}\Theta_0(s)$ which is the phase $\Theta_{ORF}$ of the RF signal. The VCO output signal is supplied to the frequency divider 50 where it is divided by $N_{CH}$ to obtain the feedback phase $\Theta_0$ which is compared at the phase detector with the input phase $\Theta_i$. The influence of the modulation on $\Theta_e$ is neglectable for $F_r=1$ and for $K_{VCO\_62}=K_{VCO\_34}$.

At the pre-setting unit or function 40, a digital pre-selection of a VCO-curve for a desired channel frequency $f_{CH}$ and the values $N_{CH}$, $K_{VCO}$, $V_{abs}$ and $V_{int}(f_{CH})$ is performed in response to a start signal S. Thus, the offset voltage $V_{int}$ and the characteristic of the VCO 30 are adjusted based on the desired frequency $f_{CH}$ to thereby increase the settling speed of the control loop in response to changes in the modulation frequency $\omega_{mode\_in}$.

The ripple filter function $F_r(s)$ can be an RC filter with no ohmic connection to ground. The input source of the loop filter 20 and the output load have high ohmic resistance values. The disadvantage of the remaining steady-state phase error shown in FIG. 4b can thus be minimized by introducing the offset voltage $V_{int}$ and a DC compensation current $I_c$. Further reductions can be achieved by additionally applying the compensation current $I_c$. The circuit shown in FIG. 5 can be used for example for frequency modulations in mobile terminals or the like. Phase errors can be perfectly compensated for the special case of $F_r(s)=1$. The phase error $\Theta_e$ is not changed when the modulation frequency $\omega_{mod\_in}$ changes.

Figure 6:
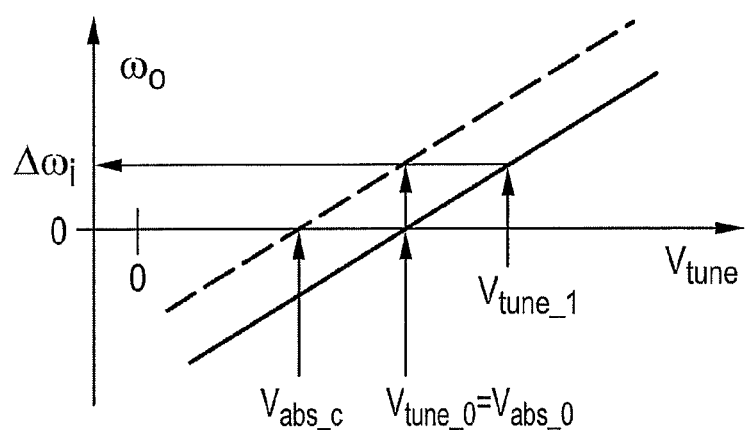
FIG. 6 shows a schematic diagram indicating a shift of a VCO curve.

FIG. 6 shows a characteristic diagram of the conversion function of the VCO 30, where the VCO curve is moved in order to shift the additional voltage $V_{abs}$ by the value—$I_c$·R or by $V_{abs}=V_{abs}(f_{CH})-\omega_{mod\_in}/K_{VCO}$. Due to this shift, the frequency change $\Delta\omega_i$ is met at the initial control voltage $V_{tune\_0}$ for the shifted curve. Thus, a change of the control voltage from $V_{tune\_0}$ to $V_{tune\_1}$ is not needed due to the change of the curve. Thereby, steady-state errors can be prevented. The shift of the VCO curve can be achieved by reducing the voltage at a varactor diode usually provided in VCOs like the VCO 30.

Figure 7:
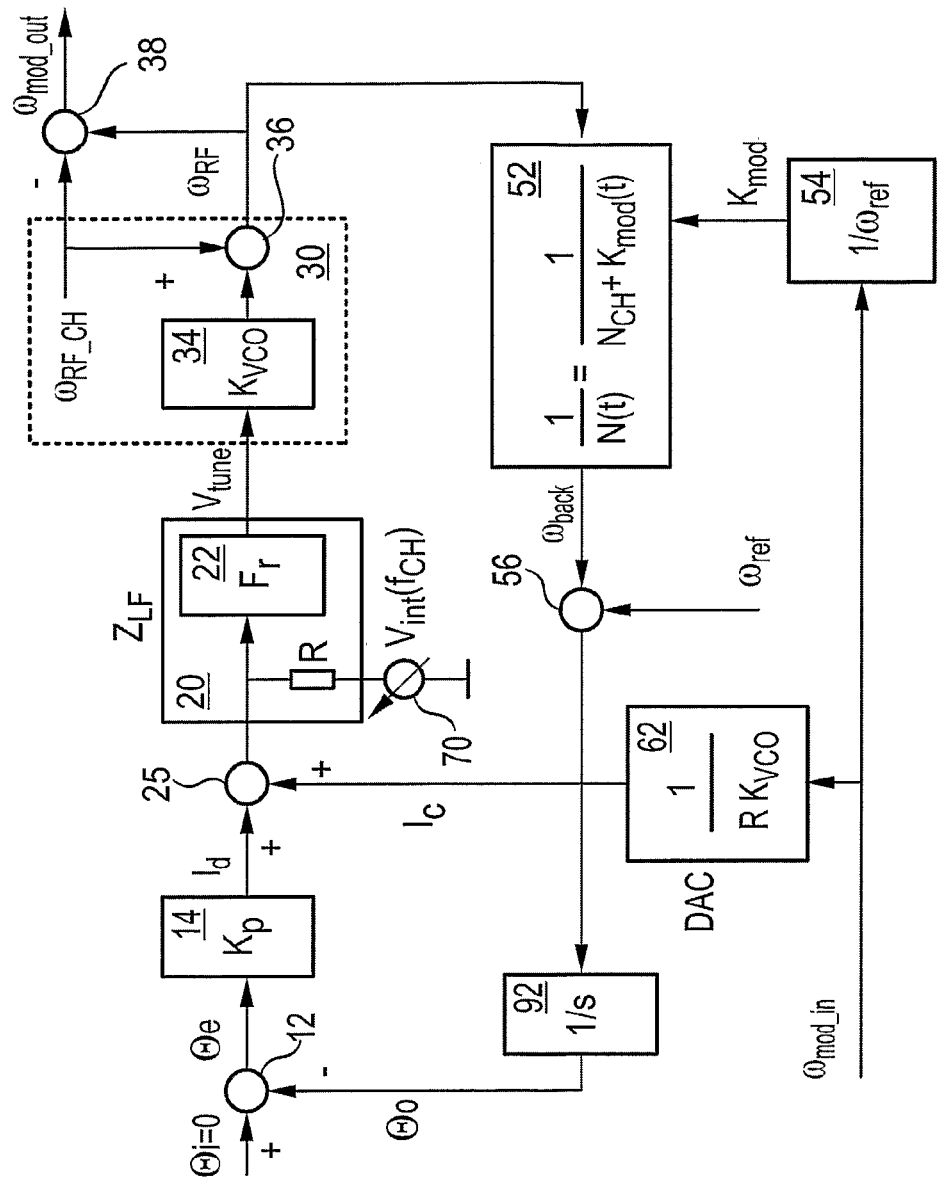
FIG. 7 shows a schematic functional block diagram of a PLL circuit according to a second preferred embodiment.

FIG. 7 shows a schematic functional block diagram of an alternative second preferred embodiment, where the modulation frequency $\omega_{mod\_in}$ is not fed to the phase input terminal of the phase detector via the conversion block 90 of FIG. 5, but is supplied to a modified fractional divider 52. The new fractional divider 52 has a divider factor $N=N_{CH}+K_{mod}(t)$, wherein $K_{mod}=\omega_{mod\_in}/\omega_{ref}$. The factor $K_{mod}(t)$ is a time-varying factor used for fractional-N transmission modulation. The modulation at the divider 52 serves to compensate modulation at $\Theta_e$. Thus the modulation of the VCO via the blocks 62 and 20 is not disturbed by the dynamic behavior of the PLL system. The modulation at the divider does the same as block 90 in FIG. 5.

In fine-step size applications, a fractional-N synthesizer or frequency generator improves the integer-N design by replacing the conventional integer-N divider by the fractional-N divider 52 of FIG. 7. This fractional-N divider 52 effectively divides a frequency of the VCO 30 by a non-integer N, which may be a fraction, e.g., as high as N/(N+/−3). The result is that the frequency generator can step by e.g. N/(N+3) of a reference frequency $\omega_{ref}$. This improvement comes at the cost of introducing a spurious response generated by the fractional-N divider 52. Delay errors and periodic behavior in an accumulator of the fractional-N divider 52 cause these spurs. However, the loop filter 20 attenuates these spurs, which restricts the loop bandwidth to reduce the spurs to an acceptable level. The result compared to an integer-N divider in FIG. 5 is that the block 90 in FIG. 5 can be omitted but at the cost of introducing unwanted spurs.

In the present second preferred embodiment, the modulation frequency $\omega_{mod\_in}$, which may be a Gaussian Minimum Shift Keying (GMSK) modulation signal at baseband and which is digitally prepared, is supplied to a ratio determination unit 54, where the ratio between the modulation frequency $\omega_{mod\_in}$ and the reference frequency $\omega_{ref}$ is calculated to obtain $K_{mod}$ which is supplied to the fractional-N divider 52. Furthermore, similar to the first preferred embodiment of FIG. 5, the input modulation frequency $\omega_{mod\_in}$ is supplied to the conversion unit 62 which may have a DAC function to generate the compensation current $I_c$ supplied to the summing node 25. Now, an input phase $\Theta_i=0$ is supplied to the subtraction node 12 of the phase detector 10. At the output of the fractional-N divider 52, a feedback frequency $\omega_{back}$ is obtained and supplied to a second subtraction node 56 (which may be included in block 10 of FIG. 1) where the reference frequency $\omega_{ref}$ is subtracted and the difference is supplied to a conversion unit 92 (in mathematical terms because the phase is the integral over frequency, and 1/s represents integration) where the frequency difference is converted into a phase difference $\Theta_0$ supplied to the first subtracting node 12.

At the VCO 30, the control voltage $V_{tune}$ is directly supplied to the conversion unit 34 which is now arranged to convert the control voltage $V_{tune}$ into a frequency signal to which a radio channel frequency $\omega_{RF\_CH}$ is added at a second summing node 36 to obtain a radio frequency $\omega_{RF}$ supplied to the fractional-N divider 52. The modulation output frequency of the PLL circuit is then obtained at the VCO 30 by generating the difference between the radio channel frequency $\omega_{RF\_CH}$ and the radio frequency $\omega_{RF}$ at a third subtraction node 38.

Hence, the PLL circuit or system according to the second preferred embodiment comprises a fractional-N synthesizer and a fractional-N transmission modulator. Modulation errors can be compensated by the compensation current $I_c$.

In the above first and second preferred embodiments, different kinds of two-point modulations are used and the integral regulator of a loop filter is replaced by introducing predetermined settings at the loop filter or at a voltage controlled oscillator. Thereby, the dynamic settling time of the PLL circuit can be improved to gain time for other circuit components which can thus assure required precision for the modulation. The compensation current $I_c$ may be implemented by the circuitry shown in FIG. 2. Furthermore, the movement of the VCO curve shown in FIG. 6 may be performed by the setting or pre-selection circuit 40, which is not explicitly shown in FIG. 7 but may as well be incorporated in the second preferred embodiment.

As an alternative, according to a third preferred embodiment, fractional-N modulation can be used with pre-compensation and without two-point modulation. In this case, the DAC 62 of FIG. 7 is no longer required and an additional pre-compensation unit has to be added in front of the ratio determination unit 54. In conventional higher-order PLL circuits with I-regulator such an additional pre-compensation unit requires exact knowledge of specific parameters of PLL circuit. However, this problem can be strongly alleviated if the I-regulator can be dispensed with, e.g. by using the pre-selection unit 40 of the above first and second embodiments. Hence, the combination of the pre-selection unit 40 with a fractional-N modulation with pre-compensation leads to an improved circuit behavior without requiring any two-point modulation.

The settings of the pre-selection unit 40 for obtaining the values of $V_{int}$ and/or the VCO characteristic can be stored or programmed during manufacturing of the PLL circuit. As an alternative, the function of the control functions are implemented as digital functions or software routines, which can be made variable until settling has finished, and are then fixed. Similarly, the VCO characteristic curves can be switched in a stepwise manner during the settling process and can be fixed after the PLL circuit has settled.

It is noted that the present invention is not restricted to the specific features of the above preferred embodiments. The offset voltage $V_{int}$ can be connected to any kind of loop filter at which a steady-state error signal is generated. Furthermore, any kind of current generation and current coupling technique can be used for adding the compensation current $I_c$ at the output of the phase detector 10 or the input of the loop filter 20. The preferred embodiments may thus vary within the scope of the attached claims.

Furthermore, the described drawing figures are only schematic and are not limiting. In the drawings, the size of some of the elements may be exaggerated and not drawn on scale for illustrative purposes. Where the term 'comprising' is used in the present description and claims, it does not exclude other elements or steps. Where an indefinite or definite article is used when referring to a singular noun, e.g. 'a' or 'an', or 'the', this includes a plurality of that noun unless something else is specifically stated. The terms first, second, third and the like in the description and in the claims are used for distinguishing between similar elements and not necessarily for describing a sequential or chronological order. It is to be understood that the embodiments of the invention described herein are capable of operating in other sequences than described or illustrated herein. Moreover, although preferred embodiments, specific constructions and configurations have been discussed herein, various changes or modifications in form and detail may be made without departing from the scope of the attached claims.

The invention claimed is:

1. A phase-locked loop circuit comprising:
a loop filter having first and second inputs;
a voltage-controlled oscillator coupled to said loop filter;
a voltage generator coupled to the first input of said loop filter and configured to supply an offset voltage to the first input of said loop filter during closed-loop operation of said phase-locked loop circuit;
a pre-selection circuit configured to select said offset voltage in accordance with a characteristic of said voltage-controlled oscillator;
a phase detector configured to provide a phase difference signal; and
a compensating circuit configured to compensate for a phase error of the phase difference signal by generating a compensation current and providing the compensation current to the second input of said loop filter, wherein said compensating circuit comprises a first conversion unit configured to convert an input modulation frequency into said compensation current.

2. A circuit according to claim 1, wherein said pre-selection circuit is adapted to set said offset voltage to a value that causes said voltage-controlled oscillator to generate a desired output frequency.

3. A circuit according to claim 1, wherein said phase-locked loop circuit is a first-order loop circuit.

4. A circuit according to claim 1, wherein said pre-selection circuit is configured to pre-select a characteristic curve of said voltage-controlled oscillator based on a desired output frequency of said voltage-controlled oscillator.

5. A circuit according to claim 1, further comprising a second conversion unit configured to convert said modulation frequency into an input phase signal and provide the input phase signal to the phase detector.

6. A circuit according to claim 1, further comprising a fractional divider and a second conversion unit configured to convert the input modulation frequency into a divider factor and provide the divider factor to the fractional divider.

7. A circuit according to claim 6, further comprising a pre-compensation unit connected to an input of said third conversion unit.

8. A circuit according to claim 1, wherein said pre-selection circuit is configured to control said voltage-controlled oscillator so as to shift said characteristic.

9. A method of compensating a phase-locked loop circuit, said method comprising:
supplying a predetermined offset voltage to a loop filter of said phase-locked loop circuit during closed-loop operation;
setting said offset voltage in accordance with a characteristic of a voltage-controlled oscillator of said phase-locked loop circuit to a value for a desired output frequency; and
compensating for a phase error of a phase detection of said phase-locked loop circuit, the compensating including generating a compensation current by converting an input modulation frequency to a compensation current and supplying said compensation current to an input of the loop filter.

10. A phase-locked loop circuit comprising:
a loop filter having an input and an input resistor;
a voltage-controlled oscillator coupled to said loop filter;
a voltage generator coupled to the input of said loop filter and configured to supply an offset voltage to the input of said loop filter during closed-loop operation of said phase-locked loop circuit;
a pre-selection circuit configured to select said offset voltage in accordance with a characteristic of said voltage-controlled oscillator;
a resistance coupled between said voltage generator and the input resistor of said loop filter; and
a compensating circuit configured to compensate for a phase error of the phase difference signal by generating a compensation current and providing the compensation current to the input of said loop filter, wherein said compensating circuit comprises a current source connected in parallel to said resistance.

11. A circuit according to claim 10, wherein said pre-selection circuit is configured to set said offset voltage to a value that causes said voltage-controlled oscillator to generate a desired output frequency.

12. A circuit according to claim 10, wherein said phase-locked loop circuit is a first-order loop circuit.

13. A circuit according to claim 10, wherein said pre-selection circuit is configured to pre-select a characteristic curve of said voltage-controlled oscillator based on a desired output frequency of said voltage-controlled oscillator.

14. A circuit according to claim 10, wherein said pre-selection circuit is configured to control said voltage-controlled oscillator so as to shift said characteristic.

* * * * *